(12) United States Patent
Jeong

(10) Patent No.: US 12,189,885 B2
(45) Date of Patent: Jan. 7, 2025

(54) DISPLAY DEVICE AND INTEGRATED CIRCUIT

(71) Applicant: LG DISPLAY CO., LTD., Seoul (KR)

(72) Inventor: Beom Jeong, Daejeon (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 18/074,460

(22) Filed: Dec. 3, 2022

(65) Prior Publication Data

US 2023/0205349 A1 Jun. 29, 2023

(30) Foreign Application Priority Data

Dec. 28, 2021 (KR) .................. 10-2021-0189893

(51) Int. Cl.
| | |
|---|---|
| *G06F 3/041* | (2006.01) |
| *G06F 3/044* | (2006.01) |
| *G09G 3/3208* | (2016.01) |
| *H10K 59/12* | (2023.01) |
| *H10K 59/40* | (2023.01) |

(52) U.S. Cl.
CPC ......... *G06F 3/0416* (2013.01); *G09G 3/3208* (2013.01); *G06F 3/044* (2013.01); *G09G 2300/0426* (2013.01); *G09G 2300/0842* (2013.01); *H10K 59/12* (2023.02); *H10K 59/40* (2023.02)

(58) Field of Classification Search
None
See application file for complete search history.

(56) References Cited

U.S. PATENT DOCUMENTS

| | | | | |
|---|---|---|---|---|
| 2014/0139480 | A1* | 5/2014 | Seo | G06F 3/0443 345/174 |
| 2019/0131375 | A1* | 5/2019 | Kim | H10K 59/124 |
| 2020/0395433 | A1* | 12/2020 | Sung | H10K 59/40 |

\* cited by examiner

*Primary Examiner* — Stephen T. Reed
(74) *Attorney, Agent, or Firm* — POLSINELLI PC

(57) ABSTRACT

A display device includes a display panel which includes a display area in which a plurality of subpixels are positioned and a non-display area positioned around the display area, a metal line positioned in the non-display area of the display panel, a first pin electrically connected to one end of the metal line, an operational circuit electrically connected to a first pin and configured to sense a characteristic value of the metal line, and a capacitor to be charged with a voltage applied to the first node, thereby providing a display device and an integrated circuit capable of effectively removing electric charges generated by a touch.

21 Claims, 11 Drawing Sheets

DISPLAY DEVICE AND INTEGRATED CIRCUIT

CROSS-REFERENCE TO RELATED APPLICATION

This application claims the priority of Korean Patent Application No. 10-2021-0189893, filed on Dec. 28, 2021, which is hereby incorporated by reference in its entirety.

BACKGROUND

Field of the Disclosure

The present disclosure relates to a display device and an integrated circuit.

Description of the Background

With the advancement of information society, the demand for display devices that display images has increased, and various types of display devices such as a liquid crystal display device and an organic light-emitting display device have been used.

In order to provide more a wider variety of functions to a user, a display device may provide a function of detecting a user's touch on a display panel and processing an input based on the detected touch.

A user may perform a touch operation through a gesture of repeatedly touching or swiping a surface of a display device as the touch operation.

Due to the repeated touching, the surface of the display device may become electrically charged. When the surface of the display device becomes electrically charged, electric charges formed on the surface of the display device may flow to a side surface of the display panel and into a display area. Accordingly, there is a problem in that display quality can be degraded

SUMMARY

Accordingly, the present disclosure is to provide a display device and an integrated circuit capable of effectively removing electric charges generated due to a touch.

More specifically, the present disclosure is to provide a display device and an integrated circuit capable of effectively removing electric charges, which are generated due to a touch operation, by a touch operation.

In an aspect of the present disclosure, a display device includes a display panel which includes a display area in which a plurality of subpixels are positioned and a non-display area positioned around the display area, a metal line positioned in the non-display area of the display panel, a first pin electrically connected to one end of the metal line, an operational circuit electrically connected to the first pin at a first node and configured to sense a characteristic value of the metal line, and a capacitor to be charged with a voltage applied to the first node.

In another aspect of the present disclosure, an integrated circuit includes a first pin electrically connected to a metal line positioned in a bezel area of a display panel, an operational circuit electrically connected to the first pin at a first node and configured to sense a characteristic value of the metal line, and a capacitor to be charged with a voltage applied to the first node.

According to the present disclosure, electric charges generated due to a touch operation can be effectively removed.

According to the present disclosure, electric charges generated due to a touch operation can be effectively removed from a display device and an integrated circuit by a touch operation.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION

Figure 1:
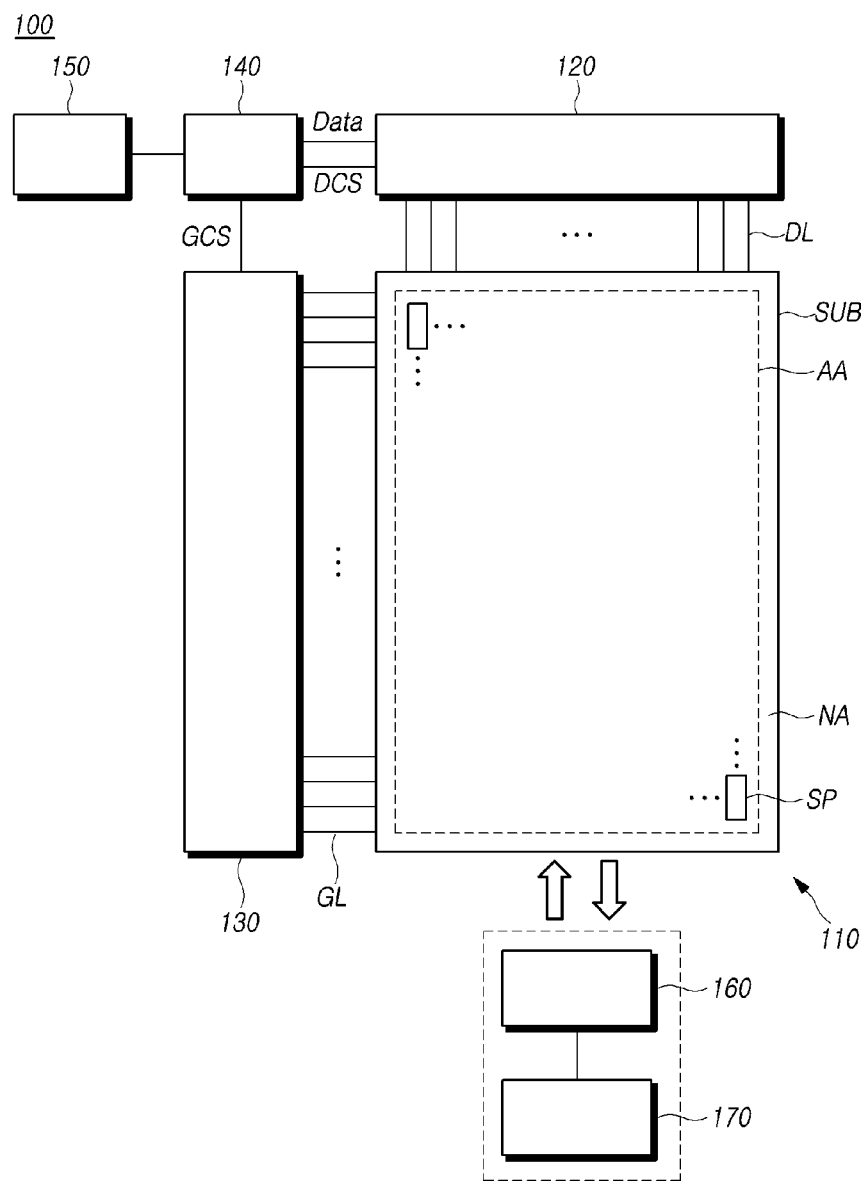
FIG. 1 is a system configuration diagram of a display device according to aspects of the present disclosure.

In the following description of examples or aspects of the present disclosure, reference will be made to the accompanying drawings in which it is shown by way of illustration specific examples or aspects that can be implemented, and in which the same reference numerals and signs can be used to designate the same or like components even when they are shown in different accompanying drawings from one another. Further, in the following description of examples or aspects of the present disclosure, detailed descriptions of well-known functions and components incorporated herein will be omitted when it is determined that the description may make the subject matter in some aspects of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various aspects of the present disclosure will be described in detail with reference to the accompanying drawings.

FIG. 1 is a system configuration diagram of a display device 100 according to aspects of the present disclosure.

Referring to FIG. 1, the display device 100 may include a display panel 110 and a display driving circuit as components for displaying an image.

The display driving circuit may be a circuit for driving the display panel 110 and may include a data driving circuit 120, a gate driving circuit 130, a display controller 140, and the like.

The display panel 110 may include a display area AA in which an image is displayed and a non-display area NA in which an image is not displayed. The non-display area NA may be an area outside the display area AA and may also be referred to as a bezel area. The entirety or a portion of the non-display area NA may be an area that is visible on a front surface of the display device 100 or an area that is bent and not visible on the front surface of the display device 100.

The display panel 110 may include a substrate SUB and a plurality of subpixels SP disposed on the substrate SUB. In addition, the display panel 110 may further include various types of signal lines to drive the plurality of subpixels SP.

The display device 100 according to aspects of the present disclosure may be a liquid crystal display device or the like, or a light-emitting display device in which the display panel 110 emits light by itself. When the display device 100 according to aspects of the present disclosure is a self-light emitting display device, each of the plurality of subpixels SP may include a light-emitting element.

For example, the display device 100 according to aspects of the present disclosure may be an organic light-emitting display device in which a light-emitting element is implemented as an organic light-emitting diode (OLED). As another example, the display device 100 according to aspects of the present disclosure may be an inorganic light-emitting display device in which a light-emitting element is implemented as an inorganic material-based light-emitting diode. As still another example, the display device 100 according to aspects of the present disclosure may be a quantum dot display device in which a light-emitting element includes quantum dots which are a semiconductor crystal that emits light by itself. The display device 100 according to aspects of the present disclosure may be a liquid crystal display device or the like, or a light-emitting display device in which the display panel 110 emits light by itself. When the display device 100 according to aspects of the present disclosure is a self-light emitting display device, each of the plurality of subpixels SP may include a light-emitting element.

A structure of each of the plurality of subpixels SP may depend on a type of the display device 100. For example, when the display device 100 is the self-light emitting display device in which the subpixels SP emit light by themselves, each subpixel SP may include a light-emitting element configured to emit light by itself, one or more transistors, and one or more capacitors.

For example, the various types of signal lines may include a plurality of data lines DL which transmit data voltages (also referred to as image signals) and a plurality of gate lines GL which transmit gate signals (also referred to as scan signals).

The plurality of data lines DL and the plurality of gate lines GL may intersect each other. Each of the plurality of data lines DL may be disposed to extend in a first direction. Each of the plurality of gate lines GL may be disposed to extend in a second direction.

Here, the first direction may be a column direction, and the second direction may be a row direction. Alternatively, the first direction may be a row direction, and the second direction may be a column direction.

The data driving circuit 120 may be a circuit configured to drive the plurality of data lines DL and may output data voltages to the plurality of data lines DL. The gate driving circuit 130 may be a circuit configured to drive the plurality of gate lines GL and may output gate signals to the plurality of gate lines GL.

The display controller 140 may be a device configured to control the data driving circuit 120 and the gate driving circuit 130. The display controller 140 may control driving timings for the plurality of data lines DL and driving timings for the plurality of gate lines GL.

The display controller 140 may supply a data driving control signal DCS to the data driving circuit 120 to control the data driving circuit 120. The display controller 140 may supply a gate driving control signal GCS to the gate driving circuit 130 to control the gate driving circuit 130.

The display controller 140 may receive input image data from the host system 150 and may supply pieces of image data Data to the data driving circuit 120 based on the input image data.

The data driving circuit 120 may supply data voltages to the plurality of data lines DL according to a driving timing controlled by the display controller 140.

The data driving circuit 120 may receive the pieces of image data Data in a digital form from the display controller 140 and may convert the received pieces of image data into analog data voltages to output the analog data voltages to the plurality of data lines DL.

The gate driving circuit 130 may supply gate signals to the plurality of gate lines GL according to a timing controlled by the display controller 140. The gate driving circuit 130 may receive a first gate voltage corresponding to a turn-on level voltage and a second gate voltage corresponding to a turn-off level voltage together with various gate driving control signals GCS, may generate gate signals, and may supply the generated gate signals to the plurality of gate lines GL.

For example, the data driving circuit 120 may be connected to the display panel 110 in a tape automated bonding (TAB) type, may be connected to a bonding pad of the display panel 110 in a chip-on-glass (COG) or chip-on-panel (COP) type, or may be implemented as a chip-on-film (COF) type and connected to the display panel 110.

The gate driving circuit 130 may be connected to the display panel 110 in a TAB type, may be connected to a bonding pad of the display panel 110 in a COG or COP type, or may be connected to the display panel in a COF type. Alternatively, the gate driving circuit 130 may be formed in the non-display area NA of the display panel 110 in a gate-in-panel (GIP) type. The gate driving circuit 130 may be disposed on the substrate SUB or may be connected to the substrate SUB. That is, when the gate driving circuit 130 is the GIP type, the gate driving circuit 130 may be disposed in the non-display area NA of the substrate SUB. When the gate driving circuit 130 is the COG type, the COF type, or the like, the gate driving circuit 130 may be connected to the substrate.

Meanwhile, at least one driving circuit of the data driving circuit 120 and the gate driving circuit 130 may be disposed in the display area AA of the display panel 110. For example, at least one driving circuit of the data driving circuit 120 and the gate driving circuit 130 may be disposed to not overlap the subpixels SP, and a portion or the entirety thereof may be disposed to overlap the subpixels SP.

The data driving circuit 120 may be connected to one side (for example, an upper or lower side) of the display panel 110. According to a driving method, a panel design method, or the like, the data driving circuit 120 may be connected to two sides (for example, upper and lower sides) of the display panel 110 or may be connected to at least two side surfaces of four side surfaces of the display panel 110.

The gate driving circuit 130 may be connected to one side (for example, a left side or a right side) of the display panel 110. According to a driving method, a panel design method, or the like, the gate driving circuit 130 may be connected to two sides (for example, the left side and the right side) of the display panel 110 or may be connected to at least two side surfaces of the four side surfaces of the display panel 110.

The display controller 140 may be implemented as a separate component from the data driving circuit 120 or may be integrated with the data driving circuit 120 and implemented as an integrated circuit.

The display controller 140 may be a timing controller used in a typical display technology, may be a control device which may include the timing controller to further perform other control functions, may be a different control device from the timing controller, or may be a circuit inside a control device. The display controller 140 may be implemented with various circuits or electronic components such as an integrated circuit (IC), a field programmable gate array (FPGA), an application specific integrated circuit (ASIC), and a processor.

The display controller 140 may be electrically connected to the data driving circuit 120 and the gate driving circuit 130 through a printed circuit board (PCB), a flexible printed circuit board (FPCB), or the like.

The display controller 140 may transmit or receive a signal to or from the data driving circuit 120 according to one or more preset interfaces. Here, for example, the interface may include a low voltage differential signaling (LVDS) interface, an external presentation interface (EPI), a serial peripheral interface (SPI), and the like.

In order to further provide a touch sensing function in addition to a video display function, the display device 100 according to aspects of the present disclosure may include a touch sensor and a touch sensing circuit which senses the touch sensor to detect whether a touch is generated by a touch object such as a finger or a pen or detect a touch position.

The touch sensing circuit may include a touch driving circuit 160 which drives and senses the touch sensor to generate and output touch sensing data and a touch controller 170 which may detect the generation of the touch or detect the touch position using the touch sensing data.

The touch sensor may include a plurality of touch electrodes. The touch sensor may further include a plurality of touch lines for electrically connecting the plurality of touch electrodes to the touch driving circuit 160.

The touch sensor may be present in the form of a touch panel outside the display panel 110 or may be present inside the display panel 110. When the touch sensor is present in the form of a touch panel outside the display panel 110, the touch sensor is referred to as an external type. When the touch sensor is the external type, the touch panel and the display panel 110 may be separately manufactured and combined during an assembly process. The touch panel in the external type may include a touch panel substrate, a plurality of touch electrodes on the touch panel substrate, and the like.

When the touch sensor is present inside the display panel 110, the touch sensor may be formed on the substrate SUB together with signal lines and electrodes related to display driving during a manufacturing process of the display panel 110.

The touch driving circuit 160 may supply a touch driving signal to at least one of the plurality of touch electrodes and may sense at least one of the plurality of touch electrodes to generate touch sensing data.

The touch sensing circuit may perform touch sensing using a self-capacitance sensing method or a mutual-capacitance sensing method.

When the touch sensing circuit performs touch sensing using the self-capacitance sensing method, the touch sensing circuit may perform touch sensing based on capacitance between each touch electrode and a touch object (for example, a finger or a pen).

According to the self-capacitance sensing method, each of the plurality of touch electrodes may serve as a driving touch electrode as well as a sensing touch electrode. The touch driving circuit 160 may drive all or some of the plurality of touch electrodes and may sense all or some of the plurality of touch electrodes.

When the touch sensing circuit performs touch sensing using the mutual-capacitance sensing method, the touch sensing circuit may perform touch sensing based on capacitance between the touch electrodes.

According to the mutual-capacitance sensing method, the plurality of touch electrodes are divided into driving touch electrodes and sensing touch electrodes. The touch driving circuit 160 may drive the driving touch electrodes and may sense the sensing touch electrodes.

The touch driving circuit 160 and the touch controller 170 included in the touch sensing circuit may be implemented as separate devices or as one device. In addition, the touch driving circuit 160 and the data driving circuit 120 may be implemented as separate devices or as one device.

The display device 100 may further include a power supply circuit for supplying various types of power to the display driving circuit and/or the touch sensing circuit.

The display device 100 according to aspects of the present disclosure may be a mobile terminal such as a smart phone or a tablet or a monitor or television (TV) having any of various sizes. However, the present disclosure is not limited thereto, and the display device 100 may be any one of various types of display devices with various sizes which are capable of displaying information or images.

Figure 2:
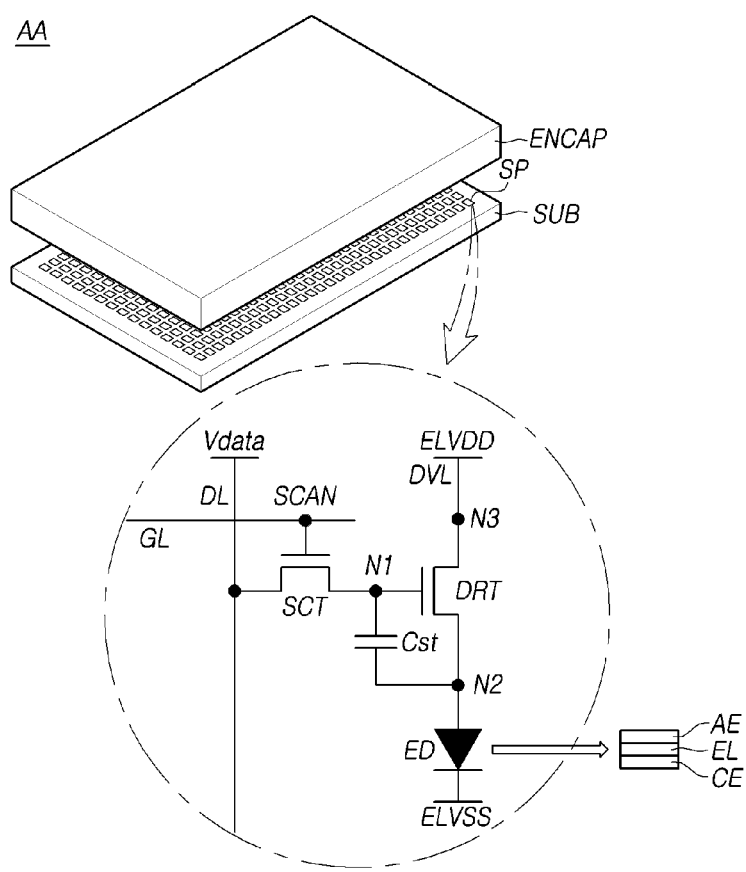
FIG. 2 is an equivalent circuit of a subpixel in a display panel according to aspects of the present disclosure.

FIG. 2 is an equivalent circuit of a subpixel SP in a display panel 110 according to aspects of the present disclosure.

Referring to FIG. 2, each subpixel SP disposed in a display area AA of the display panel 110 may include a light-emitting element ED, a driving transistor DRT for driving the light-emitting element ED, a scan transistor SCT for transmitting a data voltage Vdata to a first node N1 of the driving transistor DRT, a storage capacitor Cst for maintaining a constant voltage during one frame, and the like.

The driving transistor DRT may include the first node N1 to which the data voltage Vdata is applied, a second node N2 electrically connected to the light-emitting element ED, and a third node N3 to which a high potential common voltage ELVDD is applied from a driving voltage line DVL. In the driving transistor DRT, the first node N1 may be a gate node, the second node N2 may be any one of a source node and a drain node, and the third node N3 may be the other of the source node and the drain node.

The light-emitting element ED may include an anode AE, a light-emitting layer EL, and a cathode CE. The anode AE may be a pixel electrode disposed in each subpixel SP and may be electrically connected to the second node N2 of the driving transistor DRT of each subpixel SP. The cathode CE may be a common electrode commonly disposed in a plurality of subpixels SP, and a low potential common voltage ELVSS may be applied thereto.

For example, the anode AE may be a pixel electrode, and the cathode CE may be a common electrode. Conversely, the anode AE may be the common electrode, and the cathode CE may be the pixel electrode. Hereinafter, for convenience of description, it is assumed that the anode AE is a pixel electrode and the cathode CE is a common electrode.

For example, the light-emitting element ED may be an organic light-emitting diode (OLED), an inorganic light-emitting diode, or a quantum dot light-emitting element. In this case, when the light-emitting element ED is the OLED, the light-emitting layer EL in the light-emitting element ED may include an organic light-emitting layer including an organic material.

The scan transistor SCT is controlled to be turned on/off by a scan signal SCAN that is a gate signal applied through a gate line GL. The scan transistor SCT may switch an electrical connection between the first node N1 of the driving transistor DRT and a data line DL.

The storage capacitor Cst may be electrically connected between the first node N1 and the second node N2 of the driving transistor DRT.

Each subpixel SP may have a 2T (transistor)-1C (capacitor) structure including two transistors DRT and SCT and one capacitor Cst as shown in FIG. 2. In some cases, each subpixel SP may further include one or more transistors or further include one or more capacitors.

The storage capacitor Cst is not a parasitic capacitor (for example, Cgs or Cgd) which is an internal capacitor that may be present between the first node N1 and the second node N2 of the driving transistor DRT and may be an external capacitor which is intentionally designed outside the driving transistor DRT.

Each of the driving transistor DRT and the scan transistor SCT may be an n-type transistor or a p-type transistor.

Since circuit elements (in particular, the light-emitting element ED) in each subpixel SP are vulnerable to external moisture or oxygen, an encapsulation layer ENCAP may be disposed in the display panel 110 to prevent the external moisture or oxygen from penetrating into the circuit elements (in particular, the light-emitting element ED). The encapsulation layer ENCAP may be disposed in a form which covers the light-emitting elements ED.

Figure 3:
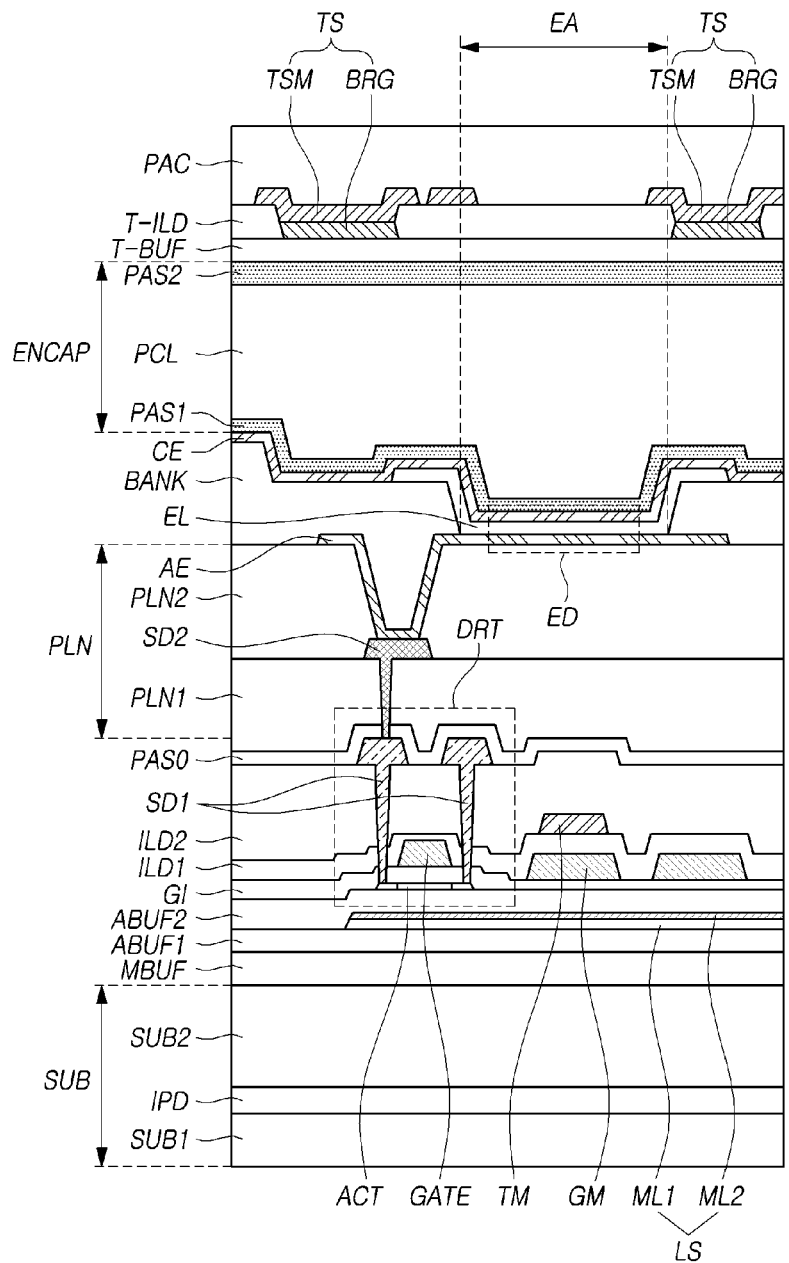
FIG. 3 is a cross-sectional view of a display area of a display panel according to aspects of the present disclosure.

FIG. 3 is a cross-sectional view of a display area AA of a display panel 110 according to aspects of the present disclosure.

Referring to FIG. 3, a substrate SUB may include a first substrate SUB1, an interlayer insulating film IPD, and a second substrate SUB2. The interlayer insulating film IPD may be positioned between the first substrate SUB1 and the second substrate SUB2. The substrate SUB is composed of the first substrate SUB1, the interlayer insulating film IPD, and the second substrate SUB2, thereby preventing the penetration of moisture. For example, the first substrate SUB1 and the second substrate SUB2 may be polyimide (PI) substrates. The first substrate SUB1 may be referred to as a primary PI substrate, and the second substrate SUB2 may be referred to as a secondary PI substrate.

Referring to FIG. 3, various patterns ACT, SD1, and GATE for forming transistors such as a driving transistor DRT, various insulating films MBUF, ABUF1, ABUF2, GI, ILD1, ILD2, and PAS0, various metal patterns TM, GM, ML1, and ML2, and the like may be included on the substrate SUB.

Referring to FIG. 3, a multi-buffer layer MBUF may be disposed on the second substrate SUB2, and a first active buffer layer ABUF1 may be disposed on the multi-buffer layer MUBF.

A first metal layer ML1 and a second metal layer ML2 may be disposed on the first active buffer layer AUBF1. Here, the first metal layer ML1 and the second metal layer ML2 may each be a light shield (LS) for shielding light.

A second active buffer layer ABUF2 may be disposed on the first metal layer ML1 and the second metal layer ML2.

A gate insulating film GI may be disposed to cover an active layer ACT.

A gate electrode GATE of the driving transistor DRT may be disposed on the gate insulating film GI.

A first interlayer insulating film ILD1 may be disposed to cover the gate electrode GATE and a gate material layer GM. The metal pattern TM may be disposed on the first interlayer insulating film ILD1. The metal pattern TM may be positioned at a position different from a position at which the driving transistor DRT is formed. A second interlayer insulating film ILD2 may be disposed to cover the metal pattern TM on the first interlayer insulating film ILD1.

Two first source-drain electrode material patterns SD1 may be disposed on the second interlayer insulating film ILD2. One of the two first source-drain electrode material patterns SD1 is a source node of the driving transistor DRT, and the other thereof is a drain node of the driving transistor DRT.

The two first source-drain electrode material patterns SD1 may be electrically connected to one side and the other side of the active layer ACT through contact holes of the second interlayer insulating film ILD2, the first interlayer insulating film ILD1, and the gate insulating film GI.

A portion of the active layer ACT overlapping the gate electrode GATE is a channel region. One of the two first source-drain electrode material patterns SD1 may be connected to one side of the channel region in the active layer ACT, and the other of the two first source-drain electrode material patterns SD1 may be connected to the other side of the channel region in the active layer ACT.

A passivation layer PAS0 is disposed to cover the two first source-drain electrode material patterns SD1. A planarization layer PLN may be disposed on the passivation layer PAS0. The planarization layer PLN may include a first planarization layer PLN1 and a second planarization layer PLN2.

The first planarization layer PLN1 may be disposed on the passivation layer PAS0.

A second source-drain electrode material pattern SD2 may be disposed on the first planarization layer PLN1. The second source-drain electrode material pattern SD2 may be connected to one of the two first source-drain electrode material patterns SD1, which corresponds to the second node N2 of the driving transistor DRT in the subpixel SP of FIG. 2, through a contact hole of the first planarization layer PLN1.

The second planarization layer PLN2 may be disposed to cover the second source-drain electrode material pattern SD2. A light-emitting element ED may be disposed on the second planarization layer PLN2.

Describing a stacked structure of the light-emitting element ED, an anode AE may be disposed on the second planarization layer PLN2. The anode AE may be electrically connected to the second source-drain electrode material pattern SD2 through a contact hole of the second planarization layer PLN2.

A bank BANK may be disposed to cover a portion of the anode AE. A portion of the bank BANK corresponding to an emission area EA of the subpixel SP may be open.

A portion of the anode AE may be exposed through an opening (open portion) of the bank BANK. A light-emitting layer EL may be positioned on a side surface of the bank BANK and in the opening (open portion) of the bank BANK. The entirety or a portion of the light-emitting layer EL may be positioned between adjacent banks BANK.

In the opening of the bank BANK, the light-emitting layer EL may be in contact with the anode AE. A cathode CE may be disposed on the light-emitting layer EL.

The light-emitting element ED may be formed by the anode AE, the light-emitting layer EL, and the cathode CE. The light-emitting layer EL may include an organic layer.

An encapsulation layer ENCAP may be disposed on the light-emitting element ED.

The encapsulation layer ENCAP may have a single-layered structure or a multi-layered structure. For example, as shown in FIG. 3, the encapsulation layer ENCAP may include a first encapsulation layer PAS1, a second encapsulation layer PCL, and a third encapsulation layer PAS2.

For example, the first encapsulation layer PAS1 and the third encapsulation layer PAS2 may be inorganic layers, and the second encapsulation layer PCL may be an organic layer. Among the first encapsulation layer PAS1, the second encapsulation layer PCL, and the third encapsulation layer PAS2, the second encapsulation layer PCL, which is an organic layer, may be the thickest and may serve as a planarization layer.

The first encapsulation layer PAS1 may be disposed on the cathode CE and may be disposed closest to the light-emitting element ED. The first encapsulation layer PAS1 may be made of an inorganic insulating material capable of being deposited at a low temperature. For example, the first encapsulation layer PAS1 may be made of silicon nitride ($SiN_x$), silicon oxide ($SiO_x$), silicon oxynitride (SiON), aluminum oxide ($Al_2O_3$), or the like. Since the first encapsulation layer PAS1 is deposited in a low temperature atmosphere, during a deposition process, the first encapsulation layer PAS1 may prevent damage to the light-emitting layer EL including an organic material vulnerable to a high temperature atmosphere.

The second encapsulation layer PCL may have a smaller area than the first encapsulation layer PAS1. In this case, the second encapsulation layer PCL may be formed to expose both end portions of the first encapsulation layer PAS1. The second encapsulation layer PCL may serve as a buffer for relieving stress between layers caused by the bending of a display device 100 and may also serve to enhance planarization performance. For example, the second encapsulation layer PCL may be made of an acrylic resin, an epoxy resin, PI, polyethylene, silicon oxycarbide (SiOC), or the like and may be made of an organic insulating material. For example, the second encapsulation layer PCL may be formed through an inkjet method.

The third inorganic encapsulation layer PAS2 may be formed on the substrate SUB, on which the second encapsulation layer PCL is formed, to cover an upper surface and a side surface of each of the second encapsulation layer PCL and the first encapsulation layer PAS1. The third encapsulation layer PAS2 may minimize or block external moisture or oxygen from penetrating into the first inorganic encapsulation layer PAS1 and the second encapsulation layer PCL. For example, the third encapsulation layer PAS2 may be made of an inorganic insulating material such as silicon nitride ($SiN_x$), silicon oxide ($SiO_x$), silicon oxynitride (SiON), or aluminum oxide ($Al_2O_3$).

Referring to FIG. 3, touch sensors TS may be disposed on the encapsulation layer ENCAP. The structure of each of the touch sensors TS will be described in detail below.

A touch buffer film T-BUF may be disposed on the encapsulation layer ENCAP. The touch sensors TS may be disposed on the touch buffer film T-BUF.

The touch sensors TS may each include a touch sensor metal TSM and a bridge metal BRG positioned on different layers.

A touch interlayer insulating film T-ILD may be disposed between the touch sensor metal TSM and the bridge metal BRG.

For example, the touch sensor metals TSM may include a first touch sensor metal TSM, a second touch sensor metal TSM, and a third touch sensor metal TSM disposed adjacent to each other. When the third touch sensor metal TSM is disposed between the first touch sensor metal TSM and the second touch sensor metal TSM, and the first touch sensor metal TSM and the second touch sensor metal TSM are to be electrically connected to each other, the first touch sensor metal TSM and the second touch sensor metal TSM may be electrically connected to each other through the bridge metal BRG disposed on a different layer therefrom. The bridge metal BRG may be insulated from the third touch sensor metal TSM by the touch interlayer insulating film T-ILD.

When the touch sensor TS is formed on the display panel 110, a chemical solution (developer, etchant, or the like) used in a process may flow therein, or moisture may flow from the outside. Since the touch sensor TS is disposed on the touch buffer film T-BUF, it is possible to prevent a chemical or moisture from penetrating into the light-emitting layer EL including an organic material during a manufacturing process of the touch sensor TS. Accordingly, the touch buffer film T-BUF may prevent damage to the light-emitting layer EL which is vulnerable to a chemical solution or moisture.

In order to prevent damage to the light-emitting layer EL including an organic material vulnerable to a high temperature, the touch buffer layer T-BUF may be formed at a low temperature of a certain temperature or less (for example, 100° C.) and may be made of an organic insulating material having a low permittivity of 1 to 3. For example, the touch buffer layer T-BUF may be made of an acryl-based material or a siloxane-based material. When the display device 100 is bent, the encapsulation layer ENCAP may be damaged, and the touch sensor metal positioned on the touch buffer film T-BUF may break. Even when the display device 100 is bent, the touch buffer film T-BUF, which is made of an organic insulating material and has planarization performance, may prevent damage to the encapsulation layer ENCAP and/or the breakage of the metals TSM and BRG constituting the touch sensor TS.

Meanwhile, referring to FIG. 3, a protective layer PAC may be disposed to cover the touch sensor TS. The protective layer PAC may be an organic insulating film.

Figure 4:
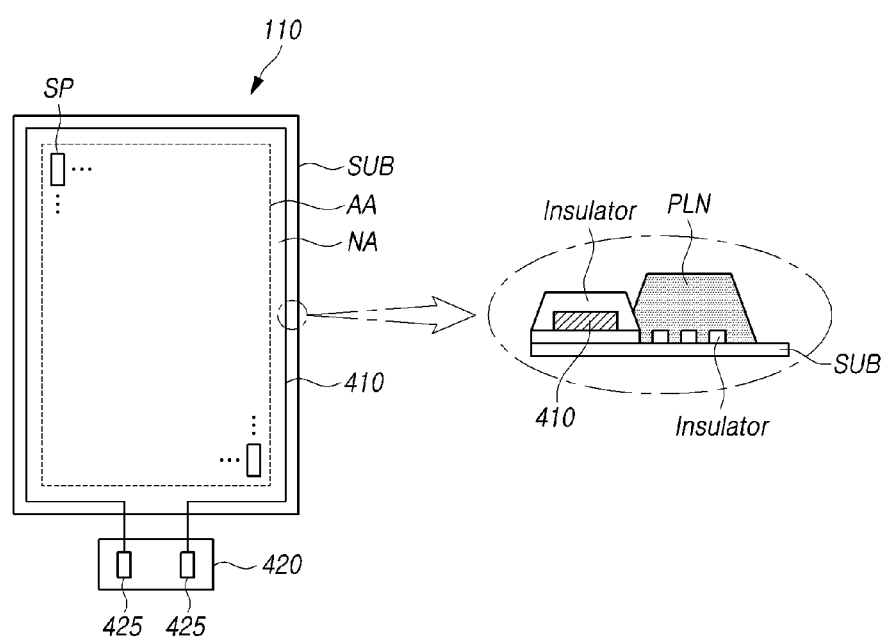
FIG. 4 is a view illustrating a metal line positioned on a display panel according to aspects of the present disclosure.

FIG. 4 is a view illustrating a metal line 410 positioned on a display panel 110 according to aspects of the present disclosure.

Referring to FIG. 4, a display device 100 according to aspects of the present disclosure includes the metal line 410 positioned on the display panel 110, and the metal line 410 is positioned in a non-display area NA around a display area AA.

The metal line 410 may be positioned in the outermost area of the display panel 110, and the metal line 410 may be a line for sensing microcracks generated in the display panel 110.

In a manufacturing process of the display panel 110, an edge area of a substrate SUB may be processed using a laser or the like. In such a process, microcracks may be generated at an edge of the substrate SUB, and external moisture or oxygen may flow into the display panel 110 through the cracks.

In order to primarily prevent external moisture or oxygen from flowing into the display panel 110, an insulating film is disposed in at least a partial area of the non-display area of the substrate SUB. A moisture permeation prevention pattern formed by removing at least a portion of an insulating film may be positioned in the outermost area of the substrate SUB. The moisture permeation prevention pattern may perform a function of increasing a length of a permeation path of oxygen or moisture. The moisture permeation prevention pattern may be covered by a planarization layer PLN including an organic material.

The insulating film may include one or more of the above-described insulating films (for example, MBUF, ABUF1, ABUF2, GI, ILD1, ILD2, and PAS).

When cracks generated outside the substrate SUB progress and reach the metal line 410, moisture or oxygen may flow into a gap exposed by the cracks.

Accordingly, when microcracks reach the metal line 410, a resistance value of the metal line 410 may change.

Accordingly, cracks generated at the edge of the substrate SUB are easily identified by sensing the resistance value of the metal line 410.

Accordingly, the display device 100 according to aspects of the present disclosure includes an integrated circuit 420, and the integrated circuit 420 includes first pins 425 electrically connected to the metal line 410.

The integrated circuit 420 applies a constant voltage having a preset voltage level to the metal line 410 through the first pin 425 electrically connected to one side of the metal line 410. The integrated circuit 420 may sense a value of a voltage dropped in the metal line 410 through the first pin 425 electrically connected to the other side of the metal line 410.

The integrated circuit 420 may further include an operational circuit (not shown) capable of calculating a resistance value of the metal line 410 and sensing whether cracks are generated. The integrated circuit 420 calculates the resistance value of the metal line 410 based on a level of the constant voltage applied to the metal line 410 and a level of the voltage sensed in the first pin 425.

The calculated resistance value of the metal line 410 is compared with a preset reference value, thereby determining whether the resistance value of the metal line 410 is included in a normal range or the resistance value of the metal line 410 is included in an abnormal range.

Figure 5:
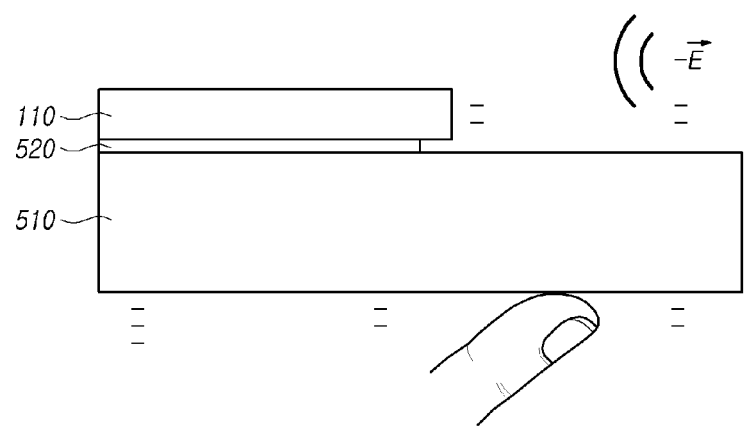
FIG. 5 is a view illustrating that a display device becomes charged by a touch operation or the like according to aspects of the present disclosure.

FIG. 5 is a view illustrating that a display device becomes charged by a touch operation or the like according to aspects of the present disclosure.

Referring to FIG. 5, the display device according to aspects of the present disclosure includes a display panel 110 and a cover window 510 positioned on a front surface of the display panel 110 to protect the display panel 110. The cover window 510 may be made of glass, plastic, or the like. A light-transmitting adhesive member 520 may be interposed between the display panel 110 and the cover window 510.

When the display device according to aspects of the present disclosure is a touch display device capable of providing a touch sensing function, a touch operation, in which a touch object such as a human finger or a pen touches a front surface of the cover window 510, may be performed.

The touch operation may include, for example, a panning operation in which a user performs a touch with his or her finger and then performs a drag without lifting the finger. The touch operation may include, for example, a swiping operation (also referred to as a scrolling operation) in which a user performs a touch with his or her finger and then performs a drag in a straight line.

As described above, as a user performs various touch operations on a surface of the cover window 510, the surface of the cover window 510 may become charged.

Electric charges with which the surface of the cover window 510 is charged may move on the surface of the cover window 510 and move toward a side surface of the display panel 110. In some cases, there may be a problem in that the charged electric charges are flow into the display panel 110.

When the electric charges with which the cover window 510 is charged flow into the display panel 110, there may be problems in that the display panel 110 abnormally glows brightly or horizontal lines occur. That is, display quality is degraded.

Accordingly, there is a need for a method of solving a problem in which display quality is degraded due to electric charges with which the cover window 510 is charged.

Figure 6:
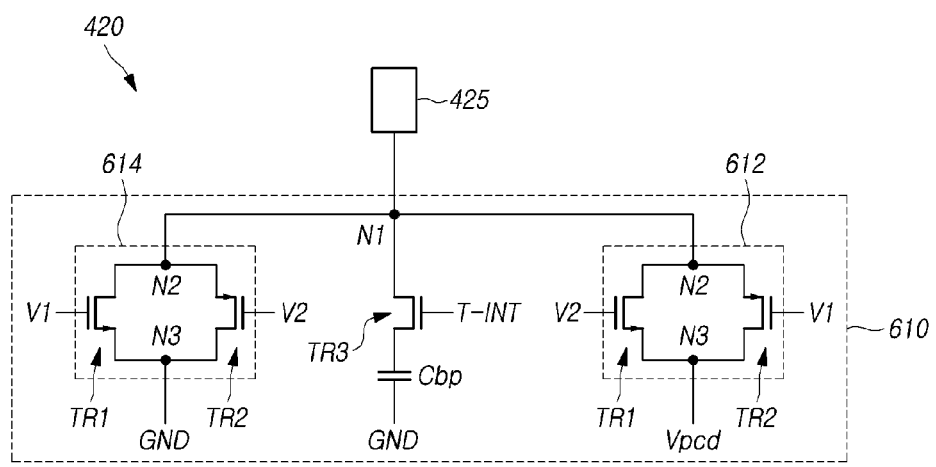
FIG. 6 is a diagram for describing that a display device is provided with an integrated circuit including a capacitor electrically connected to a metal line according to aspects of the present disclosure.

FIG. 6 is a diagram for describing that a display device is provided with an integrated circuit 420 including a capacitor Cbp electrically connected to a metal line according to aspects of the present disclosure.

The display device according to aspects of the present disclosure includes first pins 425 electrically connected to the metal line and switching circuits 610 of which is electrically connected to the first pins 425 at the first node N1.

The switching circuits 610 may include a first switching circuit 612, a second switching circuit 614, and a third switching circuit.

The first switching circuit 612 may be a switching circuit that is turned on during a period for inspecting whether cracks are generated in a display panel. During a period in which the first switching circuit 612 is turned on, the second switching circuit 614 and the third switching circuit may not be turned on.

During the period in which the first switching circuit 612 is turned on, a constant voltage (for example, Vpcd_TX) having a preset level may be applied to the first pin 425 electrically connected to one side of the above-described metal line. During the period in which the first switching circuit 612 is turned on, a voltage (for example, Vpcd_RX) that drops from the constant voltage may be applied to the first pin 425 electrically connected to the other side of the above-described metal line.

Accordingly, the integrated circuit 420 may calculate a resistance value of the metal line by sensing the voltage of the first pin 425 electrically connected to the other side of the metal line.

Meanwhile, the first switching circuit 612 and the second switching circuit 614 are turned on in different periods.

For example, referring to FIG. 6, each of the first switching circuit 612 and the second switching circuit 614 may include both of a first transistor TR1 and a second transistor TR2. Here, in the first switching circuit 612, a first voltage V1 may be applied to a gate node of the second transistor TR2, and a second voltage V2 may be applied to a gate node of the first transistor TR1. In the second switching circuit 614, the first voltage V1 may be applied to a gate node of the first transistor TR1, and the second voltage V2 may be applied to a gate node of the second transistor TR2.

Voltage levels of the first voltage V1 and the second voltage V2 are changed according to a mode in which the integrated circuit 420 is driven.

For example, during a period in which the integrated circuit 420 operates in a "panel crack detection mode," the first voltage V1 is a turn-on level voltage of the second transistor TR2 and is a turn-off level voltage of the first transistor TR1, and the second voltage V2 is a turn-on level voltage of the first transistor TR1 and is a turn-off level voltage of the second transistor TR2.

During a period in which the integrated circuit 420 operates in a "normal mode," the first voltage V1 is a turn-on level voltage of the first transistor TR1 and is a turn-off level voltage of the second transistor TR2, and the second voltage V2 is a turn-on level voltage of the second transistor TR2 and is a turn-off level voltage of the first transistor TR1.

Accordingly, the first switching circuit 612 and the second switching circuit 614 are turned on in different periods. A period in which the first switching circuit 612 is turned on does not overlap a period in which the second switching circuit 614 is turned on.

The first transistor TR1 and the second transistor TR2 may operate in different voltage level periods.

For example, the first transistor TR1 may be an n-channel metal oxide semiconductor (NMOS) transistor, and the second transistor TR2 may be a p-channel metal oxide semiconductor (PMOS) transistor. Alternatively, the first transistor TR1 may be a PMOS transistor, and the second transistor TR2 may be an NMOS transistor.

Hereinafter, for convenience of description, it will be described that the first transistor TR1 is an NMOS transistor and the second transistor TR2 is a PMOS transistor, but the present disclosure is not limited thereto.

Referring to FIG. 6, a source node of the first transistor TR1 is electrically connected to a drain node of the second transistor TR2. A drain node of the first transistor TR1 may be electrically connected to a source node of the second transistor TR2.

Referring to FIG. 6, the third switching circuit configured to switch an electrical connection between the first node N1 and the capacitor Cbp may include a third transistor TR3. Any one of a source node and a drain node of the third transistor TR3 is electrically connected to the first node N1. The other of the source node and the drain node of the third transistor TR3 is electrically connected to one end of the capacitor Cbp. A signal having a turn-on level voltage or a signal having a turn-off level voltage is applied to a gate node of the third transistor TR3. Such a signal may be a logic signal having two levels and may be a signal having three or more levels in some cases.

Hereinafter, it is assumed that the third switching circuit is the third transistor TR3, but the present disclosure is not limited thereto.

The third transistor TR3 may be a transistor which is controlled to be turned on or off by a logic signal. The logic signal may be a signal having a turn-on level voltage applied to the third transistor TR3 or a signal having a turn-off level voltage applied to the third transistor TR3.

The logic signal may be a touch interrupt signal T-INT. The touch interrupt signal T-INT is a signal that is output by a voltage level thereof being changed when a touch controller 170 (see FIG. 1) detects the generation of a touch. When the touch controller 170 detects the generation of a touch, the touch controller 170 outputs the touch interrupt signal T-INT having a turn-on level voltage. When the touch controller 170 does not detect the generation of a touch, the touch controller 170 outputs the touch interrupt signal T-INT having a turn-off level voltage.

When the touch interrupt signal T-INT having a turn-on level voltage is input to the gate node of the third transistor TR3, the third transistor TR3 is turned on, and the first node N1 is electrically connected to the capacitor Cbp. Such a capacitor Cbp is also referred to as a bypass capacitor Cbp.

Referring to the description above with reference to FIG. 5, a cover window may be charged by a touch operation of a user, and some of charged electric charges may flow into the display panel. In addition, the touch controller detects the generation of a touch and outputs the touch interrupt signal having a turn-on level voltage to the third transistor TR3.

The charged electric charges is transmitted to a metal line 410 positioned at the outermost portion of the display panel and then are charged in the capacitor Cbp through a first pin 425.

When the touch operation of the user is completed, the touch controller outputs the touch interrupt signal T-INT having a turn-off level voltage. Accordingly, the third transistor TR3 is turned off.

When the touch operation of the user is completed, electric charges charged in the capacitor Cbp are discharged to a low potential power supply GND. When the touch operation of the user is resumed, the capacitor Cbp may be charged again.

Accordingly, in the display device according to aspects of the present disclosure, electric charges generated by a touch operation are removed through the touch operation, thereby considerably reducing the degradation of display quality.

Figure 7:
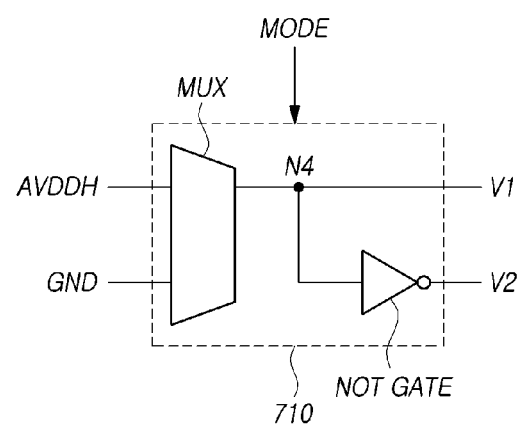
FIG. 7 is a diagram illustrating a multiplexer circuit for exchanging voltage levels of a first voltage and a second voltage in a display device according to aspects of the present disclosure.

FIG. 7 is a diagram illustrating a multiplexer circuit 710 for exchanging voltage levels of a first voltage V1 and a second voltage V2 in a display device according to aspects of the present disclosure.

Referring to FIG. 7, the multiplexer circuit 710 includes a multiplexer MUX which receives a high potential voltage (for example, an integrated circuit driving voltage AVDDH) and a low potential voltage (for example, a ground voltage GND).

The multiplexer MUX selects any one of the high potential voltage and the low potential voltage and outputs the selected voltage as the first voltage V1.

The multiplexer circuit 710 includes an inverter NOT GATE which receives a voltage of an output terminal N4 of the multiplexer MUX.

The inverter NOT GATE is a logic gate which outputs a value opposite to an input value. For example, when a high potential voltage (for example, AVDDH) is input to the inverter NOT GATE, the inverter NOT GATE outputs a low potential voltage (for example, GND) as the second voltage V2. Also, when a low potential voltage (for example, GND) is input to the inverter NOT GATE, the inverter NOT GATE outputs a high potential voltage (for example, AVDDH) as the second voltage V2.

Voltage values of the first voltage V1 and the second voltage V2 output from the multiplexer circuit 710 may be controlled by a mode control signal MODE.

According to the mode control signal MODE, any one of the high potential voltage and the low potential voltage is output as the first voltage V1, and the other of the high potential voltage and the low potential voltage is output as the second voltage V2.

Such a mode control signal MODE may be a signal that distinguishes a "panel crack inspection mode" and a "normal mode." In some cases, the mode control signal MODE may be a signal for simply changing a mode.

During a period in which the integrated circuit 420 (see FIG. 6) operates in the "panel crack inspection mode," the low potential voltage may be output as the first voltage V1, and the high potential voltage may be output as the second voltage V2.

During a period in which the integrated circuit 420 operates in the "normal mode," the high potential voltage may be output as the first voltage V1, and the low potential voltage may be output as the second voltage V2.

The multiplexer circuit 710 may be included in the integrated circuit 420 and may be provided as a separate circuit from the integrated circuit 420.

Accordingly, voltage levels of the first voltage V1 and the second voltage V2 may be changed according to an operation mode of the integrated circuit 420.

Figure 8:
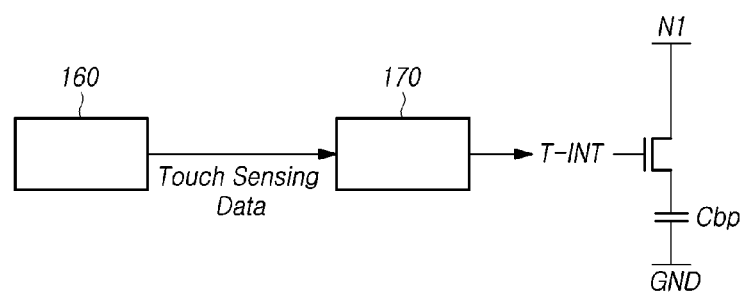
FIG. 8 is a diagram for describing that a touch controller differently outputs a level of a touch interrupt signal according to whether a touch is detected according to aspects of the present disclosure.

FIG. 8 is a diagram for describing that a touch controller 170 differently outputs a level of a touch interrupt signal T-INT according to whether a touch is detected according to aspects of the present disclosure.

Referring to FIG. 8, a touch driving circuit 160 may supply a touch driving signal to at least one of a plurality of touch electrodes (not shown) and sense at least one of the plurality of touch electrodes to generate touch sensing data.

The touch driving circuit 160 may output the generated touch sensing data to the touch controller 170, and the touch controller 170 may receive the touch sensing data generated by the touch driving circuit 160 to detect whether a touch is generated.

The touch controller 170 detects whether a touch is generated and outputs the touch interrupt signal T-INT having a turn-on level voltage or a turn-off level voltage according to whether the touch is generated.

When a transistor is turned on by the touch interrupt signal T-INT, a capacitor Cbp is charged, and when the transistor is turned off by the touch interrupt signal T-INT, the capacitor Cbp is discharged.

Figure 9:
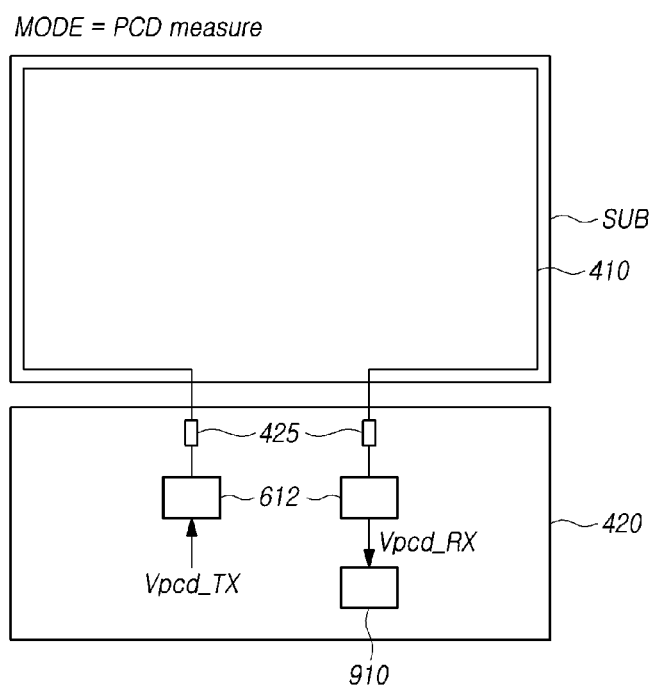
FIG. 9 is a system diagram when an operation mode of an integrated circuit is a panel crack detection mode in a display device according to aspects of the present disclosure.

FIG. 9 is a system diagram when an operation mode of an integrated circuit 420 is a panel crack detection mode (PCD measure) in a display device according to aspects of the present disclosure.

Referring to FIG. 9, when the integrated circuit 420 operates in the panel crack detection mode (PCD measure), a first switching circuit 612 is turned on, and a constant voltage Vpcd_TX having a preset level is input to one side of a metal line 410. During the corresponding period, a second switching circuit 614 and a third switching circuit are in a turned-off state.

A dropped voltage Vpcd_RX is output to the other side of the metal line 410. The dropped voltage Vpcd_RX is input to an operational circuit 910.

The operational circuit 910 may calculate a characteristic value of the metal line 410 based on a value of the dropped voltage Vpcd_RX. The characteristic value of the metal line 410 may be, for example, a resistance value of the metal line 410.

For example, when the dropped voltage Vpcd_RX is included in a normal range, it may be determined that the resistance value of the metal line 410 is in the normal range. Accordingly, the metal line 410 may not be exposed by cracks.

When the dropped voltage Vpcd_RX is included in an abnormal range, it may be determined that the resistance value of the metal line 410 is in the abnormal range. For example, when the dropped voltage Vpcd_RX is greater than the normal range, it may be determined that the resistance value of the metal line 410 is lowered due to moisture or the like introduced from cracks. Accordingly, it is determined that cracks are generated in a substrate SUB, and thus it may be determined that the substrate SUB is defective.

Figure 10:
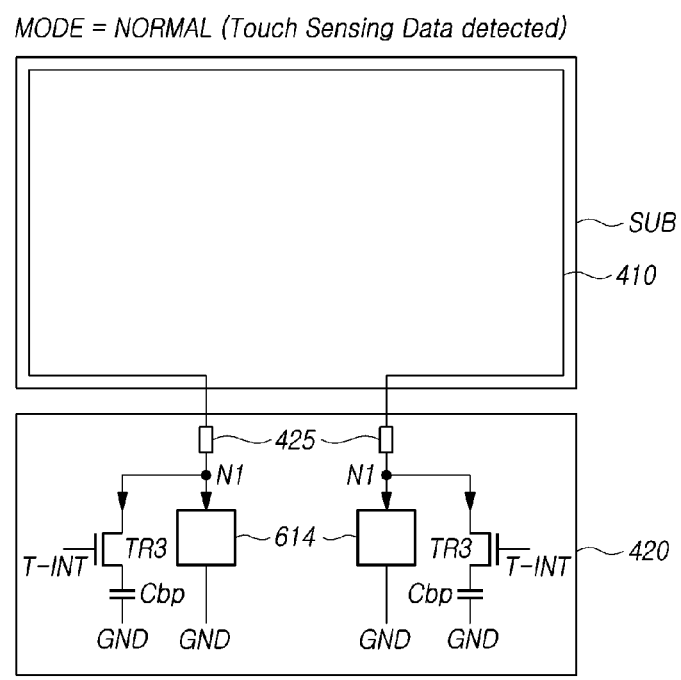
FIG. 10 is a first system diagram when an operation mode of an integrated circuit is a normal mode in a display device according to aspects of the present disclosure.

FIG. 10 is a first system diagram when an operation mode of an integrated circuit 420 is a normal mode in a display device according to aspects of the present disclosure.

Referring to FIG. 10, when the operation mode of the integrated circuit 420 in the display device according to the aspects of the present disclosure is the normal mode, a second switching circuit 614 is in a turned-on state. Accordingly, a first pin 425 is electrically connected to a low potential power supply GND.

Meanwhile, when a touch controller determines that a touch is detected, the touch controller outputs a touch interrupt signal T-INT having a turn-on level voltage. Accordingly, a third transistor TR3 is turned on.

Accordingly, electric charges generated by a touch operation flow into the low potential power supply GND through a metal line 410 positioned at a peripheral portion of a display panel.

Accordingly, the electric charges generated by the touch operation may flow into the ground power supply due to a touch operation. Accordingly, it is possible to prevent display quality from being degraded.

Figure 11:
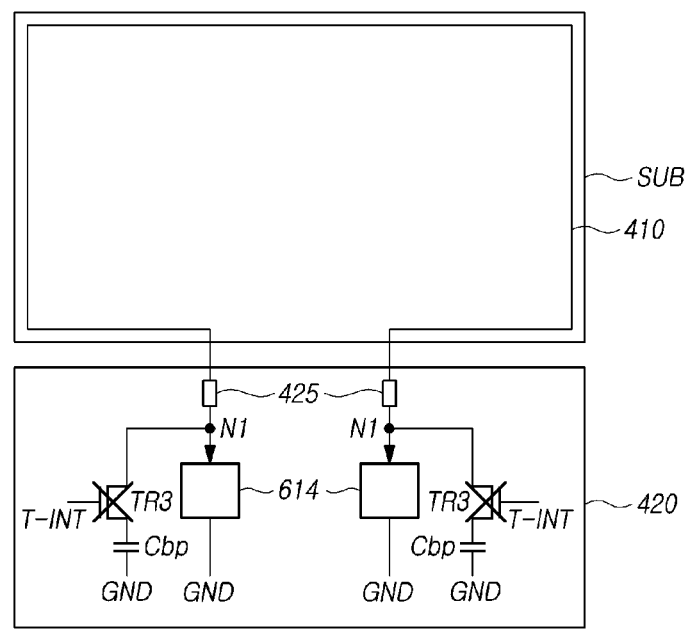
FIG. 11 is a second system diagram when an operation mode of an integrated circuit is a normal mode in a display device according to aspects of the present disclosure.

FIG. 11 is a second system diagram when an operation mode of an integrated circuit 420 is a normal mode in a display device according to aspects of the present disclosure.

Referring to FIG. 11, when a touch controller determines that no touch is detected, the touch controller outputs a touch interrupt signal T-INT having a turn-off level voltage. Accordingly, a third transistor TR3 is turned off.

A capacitor Cbp discharges charged electric charges to a low potential power supply GND.

A second switching circuit 614 is in a turned-on state, and a metal line 410 is electrically connected to the low potential power supply GND. Accordingly, in a state in which there is no touch operation, some electric charges that may flow into a display panel flow into the low potential power supply GND through the metal line 410.

Such an integrated circuit 420 and the data driving circuit 120 may be formed in one integrated circuit (for example, a source driver integrated circuit (SDIC)).

The above-described aspects of the present disclosure will be briefly described below.

Aspects of the present disclosure may provide a display device 100 including a display panel 110 which includes a display area AA in which a plurality of subpixels SP are positioned and a non-display area NA positioned around the display area AA, a metal line 410 positioned in the non-display area NA of the display panel 110, a first pin 425 electrically connected to one end of the metal line 410, an operational circuit 910 electrically connected to the first pin 425 at a first node N1 and configured to sense a characteristic value of the metal line 410, and a capacitor Cbp to be charged with a voltage applied to the first node N1.

Aspects of the present disclosure may provide the display device 100 in which the operational circuit 910 and the capacitor Cbp are positioned in one integrated circuit 420.

Aspects of the present disclosure may provide the display device 100 in which the integrated circuit 420 further includes a first switching circuit 612 configured to switch an electrical connection between the operational circuit 910 and the first node N1, and a period in which the capacitor Cbp is charged is different from a period in which the first switching circuit 612 is turned on.

Aspects of the present disclosure may provide the display device 100 in which the capacitor Cbp includes one end electrically connected to the first node N1 and the other end electrically connected to a low potential power supply GND, and the integrated circuit 420 further includes a second switching circuit 614 configured to switch an electrical connection between the low potential power supply GND and the first node N1, and a third switching circuit (for example, a third transistor TR3) configured to switch an electrical connection between the first node N1 and the one end of the capacitor Cbp.

Aspects of the present disclosure may provide the display device 100 in which a period in which the second switching circuit 614 is turned on at least partially overlaps a period in which the third switching circuit is turned on.

Aspects of the present disclosure may provide the display device 100 further including a plurality of data lines DL positioned in the display area AA and electrically connected to the plurality of subpixels SP, and a data driving circuit 120 configured to supply a data voltage Vdata to the plurality of data lines DL, wherein the integrated circuit 420 further includes the data driving circuit 120.

Aspects of the present disclosure may provide the display device 100 further including a touch sensor TS to which a touch driving signal for sensing a touch is input, a touch driving circuit 160 configured to generate and output the touch driving signal input to the touch sensor and generate and output touch sensing data, and a touch controller 170 configured to detect whether the touch is generated based on the touch sensing data input from the touch driving circuit 160, wherein, during a period in which the touch controller 170 determines that the touch is detected, the capacitor Cbp and the first node N1 are electrically connected to each other.

Aspects of the present disclosure may provide the display device 100 in which the touch controller 170 outputs a signal having a turn-on level voltage or a signal having a turn-off level voltage to a switching circuit (third switching circuit) configured to switch an electrical connection between the first node N1 and the capacitor Cbp.

Aspects of the present disclosure may provide the display device 100 in which the touch controller 170 outputs the signal having the turn-on level voltage to the switching circuit upon determining that the touch is detected and outputs the signal having the turn-off level voltage to the switching circuit upon determining that no touch is detected.

Aspects of the present disclosure may provide the display device 100 in which the display panel 110 includes a substrate SUB, a moisture permeation prevention pattern positioned adjacent to the metal line 410, an insulating film configured to cover the metal line 410, and an organic layer positioned on the moisture permeation prevention pattern.

Aspects of the present disclosure may provide the display device 100 in which the moisture permeation prevention pattern is formed by removing at least a portion of an inorganic insulating film positioned on the substrate SUB.

Aspects of the present disclosure may provide an integrated circuit 420 including a first pin 425 electrically connected to a metal line 410 positioned in a bezel area of a display panel 110, an operational circuit 910 electrically connected to the first pin 425 at a first node N1 and configured to sense a characteristic value of the metal line 410, and a capacitor Cbp to be charged with a voltage applied to the first node N1.

Aspects of the present disclosure may provide the integrated circuit 420 in which the capacitor Cbp includes one end electrically connected to the first node N1 and the other end electrically connected to a low potential power supply GND.

Aspects of the present disclosure may provide the integrated circuit 420 in which a characteristic value of the metal line 410 is a resistance value of the metal line 410.

Aspects of the present disclosure may provide the integrated circuit 420 further including a first switching circuit 612 configured to switch an electrical connection between the first node N1 and the operational circuit 910, a second switching circuit 614 configured to switch an electrical connection between the first node N1 and a low potential power supply GND, and a third switching circuit 616 configured to switch an electrical connection between the first node N1 and one end of the capacitor Cbp.

Aspects of the present disclosure may provide the integrated circuit 420 in which the third switching circuit 616 is turned on during at least a partial period of a period in which the second switching circuit 614 is turned on.

Aspects of the present disclosure may provide the integrated circuit 420 in which the first switching circuit 612 and the second switching circuit 614 each include at least one first transistor TR1 and at least one second transistor TR2, a source node of the first transistor TR1 is electrically connected to a drain node of the second transistor TR2, and a drain node of the first transistor TR1 is electrically connected to a source node of the second transistor TR2.

Aspects of the present disclosure may provide the integrated circuit 420 in which the first transistor TR1 is any one of an NMOS transistor and a PMOS transistor, and the second transistor TR2 is the other of the NMOS transistor and the PMOS transistor.

Aspects of the present disclosure may provide the integrated circuit 420 in which a voltage applied to a gate node of the first transistor TR1 included in the first switching circuit 612 is the same as a voltage applied to a gate node of the second transistor TR2 included in the second switching circuit 614, and a voltage applied to a gate node of the second transistor TR2 included in the first switching circuit 612 is the same as a voltage applied to a gate node of the first transistor TR1 included in the second switching circuit 614.

Aspects of the present disclosure may provide the integrated circuit 420 further including a multiplexer circuit 710 configured to output any one of a low potential voltage and a high potential voltage as a first voltage V1 and output the other voltage of the low potential voltage and the high potential voltage as a second voltage V2, wherein the low potential voltage is a turn-on level voltage of the first transistor TR1 and is a turn-off level voltage of the second transistor TR2, and the high potential voltage is a turn-on level voltage of the second transistor TR2 and is a turn-off level voltage of the first transistor TR1.

The above description has been presented to enable any person skilled in the art to make and use the technical idea of the present disclosure, and has been provided in the context of a particular application and its requirements. Various modifications, additions and substitutions to the described aspects will be readily apparent to those skilled in the art, and the general principles defined herein may be applied to other aspects and applications without departing from the spirit and scope of the present disclosure. The above description and the accompanying drawings provide an example of the technical idea of the present disclosure for illustrative purposes only. That is, the disclosed aspects are intended to illustrate the scope of the technical idea of the present disclosure. Thus, the scope of the present disclosure is not limited to the aspects shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A display device comprising:
a display panel which includes a display area in which a plurality of subpixels are positioned and a non-display area positioned around the display area;
a metal line positioned in the non-display area of the display panel;
an operational circuit electrically connected to a first node and configured to sense a characteristic value of the metal line; and
a capacitor having one end electrically connected to the metal line and storing an electric charge generated by a user's touch transmitted through the metal line,
wherein the operational circuit and the capacitor are positioned in an integrated circuit,
wherein the metal line is not connected to the plurality of subpixels, and
wherein the integrated circuit applies a constant voltage having a preset voltage level to one side of the metal line and sense a voltage dropped in the metal line from another side of the metal line.

2. The display device of claim 1, wherein the integrated circuit comprises a first switching circuit configured to switch an electrical connection between the operational circuit and the first node, and
wherein a period in which the capacitor is charged is different from a period in which the first switching circuit is turned on.

3. The display device of claim 1, wherein another end of the capacitor is electrically connected to a low potential power supply, and
wherein the integrated circuit further comprises a second switching circuit configured to switch an electrical connection between the low potential power supply and the first node, and a third switching circuit configured to switch an electrical connection between the first node and the one end of the capacitor.

4. The display device of claim 3, wherein a period in which the second switching circuit is turned on at least partially overlaps with a period in which the third switching circuit is turned on.

5. The display device of claim 1, further comprising:
a plurality of data lines positioned in the display area and electrically connected to the plurality of subpixels; and
a data driving circuit configured to supply a data voltage to the plurality of data lines,
wherein the integrated circuit further comprises the data driving circuit.

6. The display device of claim 1, further comprising:
a touch sensor to which a touch driving signal for sensing a touch is input;
a touch driving circuit configured to generate and output the touch driving signal input to the touch sensor and generate and output touch sensing data; and
a touch controller configured to detect whether the touch is generated based on the touch sensing data input from the touch driving circuit,
wherein, during a period in which the touch controller determines that the touch is detected, the capacitor and the first node are electrically connected to each other.

7. The display device of claim 6, wherein the touch controller outputs a signal having a turn-on level voltage or a signal having a turn-off level voltage to a switching circuit configured to switch an electrical connection between the first node and the capacitor.

8. The display device of claim 7, wherein the touch controller outputs the signal having the turn-on level voltage to the switching circuit upon determining that the touch is detected and outputs the signal having the turn-off level voltage to the switching circuit upon determining that no touch is detected.

9. The display device of claim 1, wherein the display panel comprises:
a substrate;
a moisture permeation prevention pattern positioned adjacent to the metal line;
an insulating film configured to cover the metal line; and
an organic layer positioned on the moisture permeation prevention pattern.

10. The display device of claim 9, wherein the moisture permeation prevention pattern is formed by removing at least a portion of an inorganic insulating film positioned on the substrate.

11. The display device of claim 1, wherein the operational circuit includes a first pin electrically connected to one end of the metal line.

12. The display device of claim 1, wherein the characteristic value of the metal line is a resistance value of the metal line.

13. An integrated circuit comprising:
a first pin electrically connected to a metal line positioned in a bezel area of a display panel;
an operational circuit electrically connected to the first pin at a first node and configured to sense a characteristic value of the metal line; and
a capacitor having one end connected to the metal line and storing an electric charge generated by a user's touch transmitted through the metal line,
wherein the metal line is not connected to a plurality of subpixels of the display panel, and
wherein the integrated circuit applies a constant voltage having a preset voltage level to one side of the metal line and sense a voltage dropped in the metal line from another side of the metal line.

14. The integrated circuit of claim 13, further comprising a low potential power supply electrically connected to another end of the capacitor.

15. The integrated circuit of claim 13, wherein the characteristic value of the metal line is a resistance value of the metal line.

16. The integrated circuit of claim 13, further comprising:
a first switching circuit configured to switch an electrical connection between the first node and the operational circuit;
a second switching circuit configured to switch an electrical connection between the first node and a low potential power supply; and
a third switching circuit configured to switch an electrical connection between the first node and the one end of the capacitor.

17. The integrated circuit of claim 16, wherein the third switching circuit is turned on during at least a partial period of a period in which the second switching circuit is turned on.

18. The integrated circuit of claim 16, wherein the first switching circuit and the second switching circuit each comprise:
at least one first transistor and at least one second transistor;
a source node of the first transistor electrically connected to a drain node of the second transistor; and
a drain node of the first transistor electrically connected to a source node of the second transistor.

19. The integrated circuit of claim 18, wherein the first transistor is one of an n-channel metal oxide semiconductor (NMOS) transistor and a p-channel metal oxide semiconductor (PMOS) transistor; and the second transistor is another one of the NMOS transistor and the PMOS transistor.

20. The integrated circuit of claim 18, wherein a voltage applied to a gate node of the first transistor included in the first switching circuit is the same as a voltage applied to a gate node of the second transistor included in the second switching circuit, and
a voltage applied to a gate node of the second transistor included in the first switching circuit is the same as a voltage applied to a gate node of the first transistor included in the second switching circuit.

21. The integrated circuit of claim 18, further comprising a multiplexer circuit configured to output one of a low potential voltage and a high potential voltage as a first voltage and output another voltage of the low potential voltage and the high potential voltage as a second voltage,
wherein the low potential voltage is a turn-on level voltage of the first transistor and is a turn-off level voltage of the second transistor, and the high potential voltage is a turn-on level voltage of the second transistor and is a turn-off level voltage of the first transistor.

* * * * *